(12) United States Patent  
Kagan et al.

(10) Patent No.: US 7,656,735 B2
(45) Date of Patent: Feb. 2, 2010

(54) DUAL VOLTAGE FLASH MEMORY METHODS

(75) Inventors: Yishai Kagan, Sunnyvale, CA (US); Michael James McCarthy, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/537,214

(22) Filed: Sep. 29, 2006

(65) Prior Publication Data

US 2008/0080254 A1 Apr. 3, 2008

(51) Int. Cl.
*G11C 5/14* (2006.01)
(52) U.S. Cl. .............. 365/226; 365/189.08; 365/189.09
(58) Field of Classification Search ............ 365/185.11, 365/185.18, 185.23, 189.08, 189.09, 226
See application file for complete search history.

(56) References Cited

U.S. PATENT DOCUMENTS

| | | | | |
|---|---|---|---|---|
| 5,070,032 A | 12/1991 | Yuan et al. | ............ | 437/43 |
| 5,095,344 A | 3/1992 | Harari | ............ | 357/23.5 |
| 5,297,148 A | 3/1994 | Harari et al. | ............ | 371/10.2 |
| 5,313,421 A | 5/1994 | Guterman et al. | ............ | 365/185 |
| 5,315,541 A | 5/1994 | Harari et al. | ............ | 365/63 |
| 5,343,063 A | 8/1994 | Yuan et al. | ............ | 257/317 |
| 5,382,839 A | 1/1995 | Shinohara | ............ | 327/545 |
| 5,396,114 A | 3/1995 | Lee et al. | ............ | 327/535 |
| 5,490,117 A | 2/1996 | Oda et al. | ............ | 365/226 |
| 5,491,660 A * | 2/1996 | Ashmore, Jr. | ............ | 365/230.02 |
| 5,570,315 A | 10/1996 | Tanaka et al. | ............ | 365/185.22 |
| 5,615,151 A | 3/1997 | Furuno et al. | ............ | 365/185.18 |
| 5,629,609 A * | 5/1997 | Nguyen et al. | ............ | 323/269 |
| 5,661,053 A | 8/1997 | Yuan | ............ | 437/43 |
| 5,774,397 A | 6/1998 | Endoh et al. | ............ | 365/185.19 |
| 5,828,892 A | 10/1998 | Mizuta | ............ | 395/750.01 |
| 6,046,935 A | 4/2000 | Takeuchi et al. | ............ | 365/185.03 |
| 6,141,245 A * | 10/2000 | Bertin et al. | ............ | 365/185.05 |
| 6,222,762 B1 | 4/2001 | Guterman et al. | ............ | 365/185.03 |
| 6,275,016 B1 * | 8/2001 | Ivanov | ............ | 323/224 |
| 6,384,628 B1 * | 5/2002 | Lacey et al. | ............ | 326/41 |
| 6,434,044 B1 * | 8/2002 | Gongwer et al. | ............ | 365/185.18 |
| 6,456,528 B1 | 9/2002 | Chen | ............ | 365/185.03 |
| 6,522,580 B2 | 2/2003 | Chen et al. | ............ | 365/185.02 |
| 6,577,535 B2 * | 6/2003 | Pasternak | ............ | 365/185.11 |

(Continued)

FOREIGN PATENT DOCUMENTS

JP 3379761 1/1993

(Continued)

OTHER PUBLICATIONS

U.S. Appl. No. 11/537,232, "Dual Voltage Flash Memory Card," filed Sep. 29, 2006, Kagan et al.

(Continued)

*Primary Examiner*—Amir Zarabian
*Assistant Examiner*—Jay Radke
(74) *Attorney, Agent, or Firm*—Jenkins, Wilson, Taylor & Hunt, P.A.

(57) ABSTRACT

A voltage regulation circuit in a nonvolatile memory card accepts an input voltage from a host at two or more different voltage levels and provides an output voltage at a single level to components including a memory die. The voltage regulation circuit can provide an output voltage that is higher or lower than the input voltage.

14 Claims, 4 Drawing Sheets

U.S. PATENT DOCUMENTS

| | | | |
|---|---|---|---|
| 6,798,709 | B2 | 9/2004 | Sim et al. .................. 365/226 |
| 6,925,007 | B2 | 8/2005 | Harari et al. ........... 365/185.15 |
| 2002/0114184 | A1 | 8/2002 | Gongwer et al. |
| 2002/0114384 | A1* | 8/2002 | Nelson et al. ............... 375/222 |
| 2003/0112691 | A1 | 6/2003 | Sundaram et al. |
| 2003/0204341 | A1* | 10/2003 | Guliani et al. ................ 702/60 |
| 2005/0141317 | A1* | 6/2005 | Kim et al. .................. 365/226 |
| 2005/0270891 | A1* | 12/2005 | Flach et al. ................. 365/233 |
| 2005/0276110 | A1 | 12/2005 | Sakurai et al. ......... 365/185.18 |
| 2006/0120198 | A1 | 6/2006 | Kubo ......................... 365/226 |
| 2007/0008801 | A1* | 1/2007 | Chiang et al. .............. 365/226 |
| 2008/0080255 | A1 | 4/2008 | Kagan et al. |

FOREIGN PATENT DOCUMENTS

WO      WO 02/067269 A2      8/2002

OTHER PUBLICATIONS

USPTO Non-Final Office-Action mailed on Dec. 18, 2007 in U.S. Appl. No. 11/537,232, 20 pages.

Official Action for U.S. Appl. No. 11/537,232 (Apr. 24, 2008).

Notification of Transmittal of the International Search Report and the Written Opinion of the International Searching Authority, or the Declaration for International Application No. PCT/US07/078834 (Apr. 4, 2008).

Official Action for U.S. Appl. No. 11/537,232 (Nov. 18, 2008).

Final Official Action for U.S. Appl. No. 11/537,232 (Apr. 29, 2009).

Interview Summary for U.S. Appl. No. 11/537,232 (Mar. 25, 2009).

Interview Summary for U.S. Appl. No. 11/537,232 (Mar. 20, 2009).

"MAX1759 Buck/Boost Regulating Charge Pump in µMAX," http://www.maxim-ic.com/quick_view2.cfm/qv_pk/2154, pp. 1-3 (Copyright 2006).

"Torex Semiconductor Ltd.," http://www.torex.co.jp/english/product/pro02/6215.html, pp. 1-2 (Copyright 2000-2002).

Notice of Allowance and Fee(s) Due for U.S. Appl. No. 11/537,232 (Oct. 19, 2009).

* cited by examiner

DUAL VOLTAGE FLASH MEMORY METHODS

CROSS REFERENCE TO RELATED APPLICATION

This application is related to an application being filed concurrently herewith by Yishai Kagan and Michael James McCarthy, entitled "Dual Voltage Flash Memory Card" which application is incorporated herein in its entirety by this reference.

BACKGROUND

This invention relates generally to the use and structure of removable nonvolatile memory devices, particularly those having standardized interfaces for connecting with other electronic systems.

Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls operation of the memory cell array and interfaces with a host to which the card is connected. Several of the same type of card may be interchanged in a host card slot designed to accept that type of card. However, the development of the many electronic card standards has created different types of cards that are incompatible with each other in various degrees. A card made according to one standard is usually not useable with a host designed to operate with a card of another standard. Memory card standards include PC Card, CompactFlash™ card (CF™ card), SmartMedia™ card, MultiMediaCard (MMC™), Secure Digital (SD) card, a miniSD™ card, Subscriber Identity Module (SIM), Memory Stick™, Memory Stick Duo card and TransFlash™ memory module standards. Small, hand-held re-programmable non-volatile memories have also been made to interface with a computer or other type of host through a Universal Serial Bus (USB) connector. There are several USB flash drive products commercially available from SanDisk Corporation under its trademark "Cruzer®." USB flash drives are typically larger and shaped differently than the memory cards described above.

Two general memory cell array architectures have found commercial application, NOR and NAND. In a typical NOR array, memory cells are connected between adjacent bit line source and drain diffusions that extend in a column direction with control gates connected to word lines extending along rows of cells. A memory cell includes at least one storage element positioned over at least a portion of the cell channel region between the source and drain. A programmed level of charge on the storage elements thus controls an operating characteristic of the cells, which can then be read by applying appropriate voltages to the addressed memory cells. Examples of such cells, their uses in memory systems and methods of manufacturing them are given in U.S. Pat. Nos. 5,070,032; 5,095,344; 5,313,421; 5,315,541; 5,343,063; 5,661,053 and 6,222,762.

The NAND array utilizes series strings of more than two memory cells, such as 16 or 32, connected along with one or more select transistors between individual bit lines and a reference potential to form columns of cells. Word lines extend across cells within a large number of these columns. An individual cell within a column is read and verified during programming by causing the remaining cells in the string to be turned on hard so that the current flowing through a string is dependent upon the level of charge stored in the addressed cell. Examples of NAND architecture arrays and their operation as part of a memory system are found in U.S. Pat. Nos. 5,570,315; 5,774,397; 6,046,935; 6,456,528 and 6,522,580.

The charge storage elements of current flash EEPROM arrays, as discussed in the foregoing referenced patents, are most commonly electrically conductive floating gates, typically formed from conductively doped polysilicon material. An alternate type of memory cell useful in flash EEPROM systems utilizes a non-conductive dielectric material in place of the conductive floating gate to store charge in a non-volatile manner. In one example, a triple layer dielectric formed of silicon oxide, silicon nitride and silicon oxide (ONO) is sandwiched between a conductive control gate and a surface of a semi-conductive substrate above the memory cell channel. The cell is programmed by injecting electrons from the cell channel into the nitride, where they are trapped and stored in a limited region, and erased by injecting hot holes into the nitride. Several specific cell structures and arrays employing dielectric storage elements are described in U.S. Pat. No. 6,925,007.

Individual flash EEPROM cells store an amount of charge in a charge storage element or unit that is representative of one or more bits of data. The charge level of a storage element controls the threshold voltage (commonly referenced as $V_T$) of its memory cell, which is used as a basis of reading the storage state of the cell. A threshold voltage window is commonly divided into a number of ranges, one for each of the two or more storage states of the memory cell. These ranges are separated by guardbands that include a nominal sensing level that allows determining the storage states of the individual cells. These storage levels do shift as a result of charge disturbing programming, reading or erasing operations performed in neighboring or other related memory cells, pages or blocks. Error correcting codes (ECCs) are therefore typically calculated by the controller and stored along with the host data being programmed and used during reading to verify the data and perform some level of data correction if necessary.

Memory cells of a typical flash EEPROM array are divided into discrete blocks of cells that are erased together. That is, the block (erase block) is the erase unit, a minimum number of cells that are simultaneously erasable. Each erase block typically stores one or more pages of data, the page being the minimum unit of programming and reading, although more than one page may be programmed or read in parallel in different sub-arrays or planes. Each page typically stores one or more sectors of data, the size of the sector being defined by the host system. An example sector includes 512 bytes of host data, following a standard established with magnetic disk drives, plus some number of bytes of overhead information about the host data and/or the erase block in which they are stored. Such memories are typically configured with 16, 32 or more pages within each erase block, and each page stores one or more sectors of host data. Host data may include user data from an application running on the host and data that the host generates in managing the memory such as FAT (file allocation table) and directory data.

A memory array is generally formed on a die ("memory die" or "chip") that may also have peripheral circuits that are connected to the memory array. Examples of peripheral circuits include row and column control circuits, registers, state machines, charge pumps and other circuits associated with reading, writing and erasing data in a memory array.

A memory controller may have several components including a central processing unit (CPU), a buffer cache (buffer RAM) and a CPU RAM. Both buffer RAM and CPU RAM may be SRAM memories. These components may be on the same die or on separate dies. The CPU is a microprocessor that runs software (firmware) to carry out operations including transferring data to and from the memory array. In one example shown in U.S. Pat. No. 5,297,148, which is incorporated herein in its entirety, a buffer cache may be used as a write cache to reduce wear on a flash EEPROM that is used as non-volatile memory. In one arrangement, a memory controller is formed as an Application Specific Integrated Circuit (ASIC) so that a single integrated circuit (controller die or chip) performs all memory controller functions.

Some memory cards may be used with different hosts that do not always use the same standards. For example, some hosts may provide power to a memory card at 3.3 volts, while others may provide power at 1.8 volts. Cards that operate with host power supplies at two different voltage levels may be considered to be dual voltage memory cards.

FIG. 1 shows a dual voltage memory card 100 of the prior art having a dual voltage controller die 102 connected to a dual voltage memory die 104. Both controller die 102 and memory die 104 receive their power from a host through a common contact 106 at a voltage $V_{DD}$ supplied by the host. Internal circuits in both controller die 102 and memory die 104 allow each die to operate whether the host provides $V_{DD}$ at 3.3 volts or 1.8 volts. Also shown in FIG. 1 is a common ground contact 108 providing a ground voltage $V_{SS}$ to both the controller die and the memory die. In addition, contacts 110a-d are provided for exchange of data, command and status information.

SUMMARY

According to one embodiment of the present invention, voltage regulation for a memory die is performed by a voltage regulation circuit that is separate from the memory die. The voltage regulation circuit provides power to the memory die at a required voltage when hosts provide power to the card at either of two or more different voltages. Thus, a dual voltage memory die is no longer required. A memory die that only works with a single power voltage may be used. Such dies are generally cheaper and smaller than dual voltage memory dies. While the voltage regulation circuit provides power to the memory die, the memory controller may receive power directly from the host at a voltage that depends on the host. A voltage regulation circuit provides an output voltage that is the same or lower than the input voltage in one embodiment. A voltage regulation circuit provides an output that is the same or higher than the input voltage in another embodiment.

In some memory systems, a controller die receives different power supplies at different voltage levels for different circuits within the controller die. For example a power supply may be provided at a first voltage level for host interface circuits, another power supply may be provided also at the first voltage level for controller core circuits and yet another supply may be provided at a second voltage level for memory interface circuits. In one example, the first voltage level is the voltage level received from the host, while the second voltage level is provided by a voltage regulation circuit within the memory card. The voltage regulation circuit may be separate from both the controller die and the memory die or may be located in the controller die. The memory die may also have different power supplies for different portions but these are generally provided with power at the same voltage level provided by the voltage regulation circuit.

Additional aspects, advantages, features and details of various aspects of the present invention are included in the following description of exemplary embodiments thereof, which description should be taken in conjunction with the accompanying drawings.

DETAILED DESCRIPTION OF ILLUSTRATED EMBODIMENTS

Figure 1:
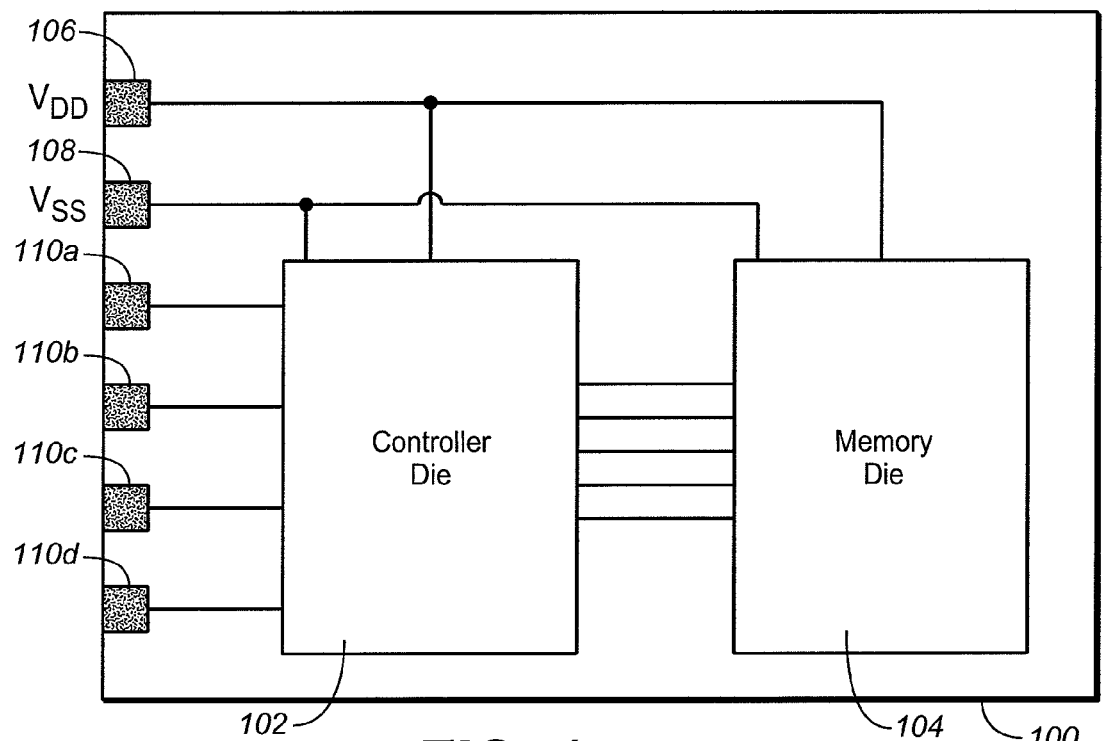
FIG. 1 shows a dual voltage memory card of the prior art having a dual voltage controller die and a dual voltage memory die.
Figure 2:
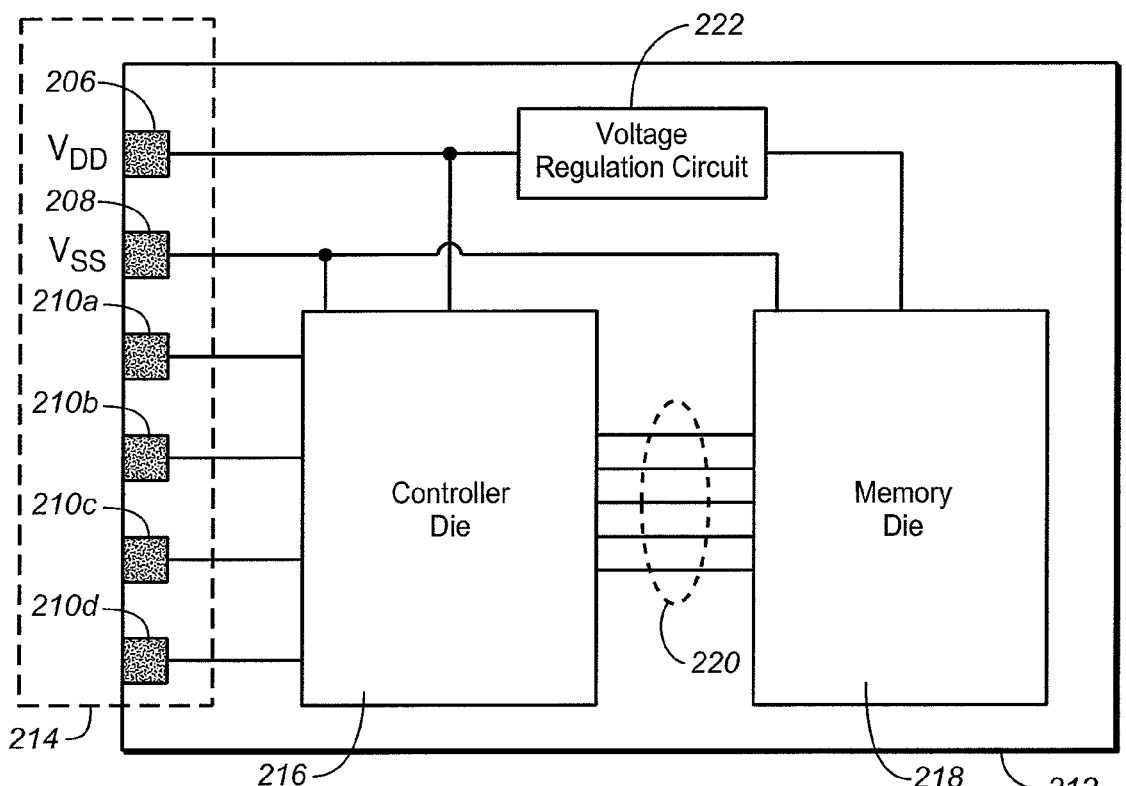
FIG. 2 shows a dual voltage memory card according to an embodiment of the present invention having a voltage regulation circuit that accepts an input voltage at two different voltage levels and provides an output at one voltage level.

FIG. 2 shows a dual voltage memory card 212 according to an embodiment of the present invention. Dual voltage memory card 212 includes a physical interface 214 according to a standard for connecting to a variety of hosts. Physical interface 214 includes individual contacts 206, 208, 210a-d that connect with corresponding contacts in a host receptacle. Contacts 206, 208, 210a-d are provided for exchange of data and also to provide power to memory card 212. In particular, a power supply contact 206 is provided that connects to a power supply contact in the host receptacle. The voltage supplied by the host to power supply contact 206 is designated $V_{DD}$. Different hosts may provide power at different voltage levels. So $V_{DD}$ may have two or more different levels depending on which host memory card 212 is connected to. In particular, memory card 212 is designed to operate with hosts providing power at two predetermined voltage levels. In other cases, cards may be designed to operate at three or more voltage levels, or to operate over a wide range of voltage levels. In addition to the power supply contact 206, a ground contact 208 provides a ground connection from the host to memory card 212 at a voltage designated $V_{SS}$.

Memory card 212 includes a controller die 216 and a memory die 218 connected together by multiple conductors that form a data bus 220. In other memory cards, additional dies may be present. For example, multiple memory dies may be provided. Also, a controller may be comprised of two or more dies that perform different controller functions instead of performing all controller functions on a single controller die.

In addition to controller die 216 and memory die 218, a voltage regulation circuit 222 is provided that supplies a regulated voltage to memory die 218. Voltage regulation circuit 222 receives an input voltage from power supply contact 206 at one of two or more different voltage levels and voltage regulation circuit 222 provides a voltage output at a fixed voltage that is not dependant on the input voltage. Thus, memory card 212 may be connected to hosts that provide power at different voltage levels, but the voltage level received by memory die 218 is regulated by voltage regulation circuit 222 so that memory die 218 does not have to be a dual voltage memory die. This may provide cost savings, space savings and also more design flexibility than is generally possible using a dual voltage memory die.

Figure 3A:
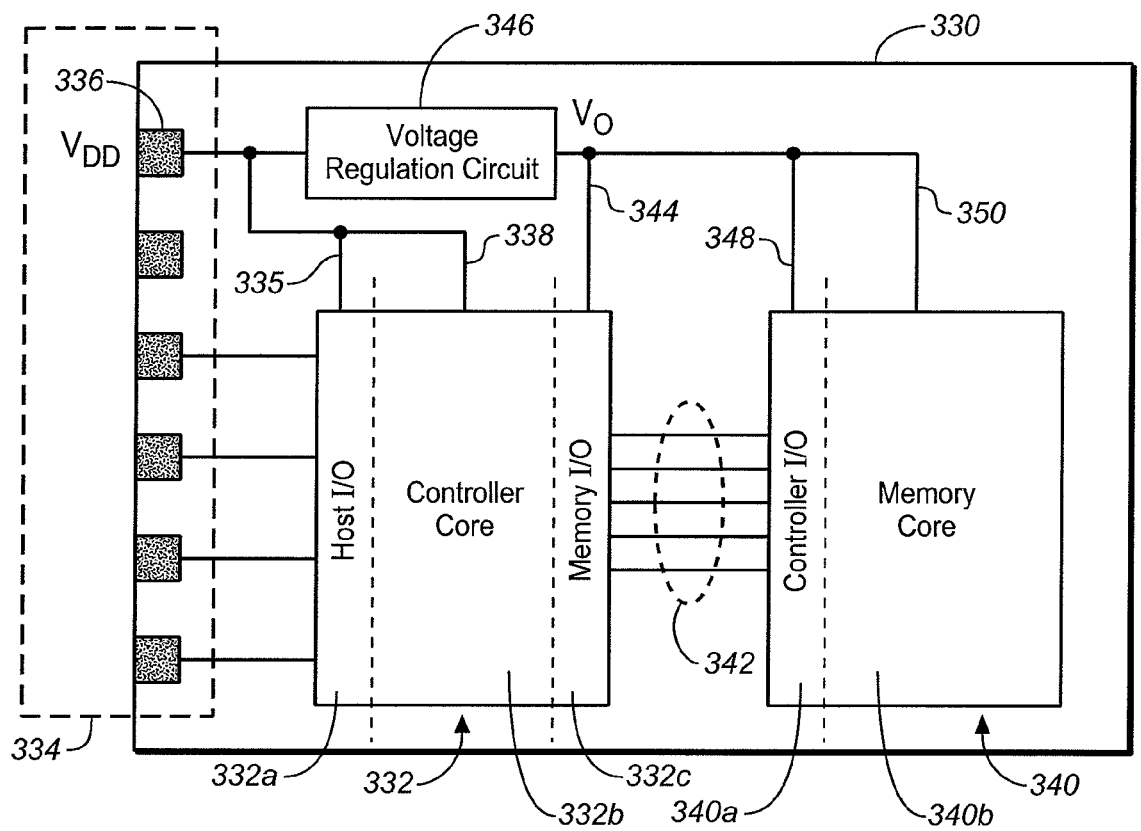
FIG. 3A shows a dual voltage memory card according to an embodiment of the present invention having portions of a controller die supplied with power at the voltage level of the host and having a memory die and a portion of the controller die supplied with a different voltage level through a voltage regulation circuit.

FIG. 3A shows a more detailed view of one embodiment of the present invention. FIG. 3A shows a dual voltage controller die 332 having three different portions 332a-c, each of which has a separate power input. A host input/output portion 332a is connected to a physical interface 334 that connects to a host. Thus, signals to and from the host pass through host input/output portion 332a. Host input/output portion 332a receives a power supply 335 that is connected to a power input contact 336. Thus, host input/output portion 332a receives power at a voltage $V_{DD}$, the voltage the host provides to memory card 330, which may be at different levels depending on the host to which memory card 330 is connected.

A controller core portion 332b contains circuits that manage data exchange between memory card 330 and the host and manage data within memory card 330. Controller core portion 332b receives a power supply 338 that is connected to power input contact 336. Thus, controller core portion 332b receives power at a voltage $V_{DD}$, the voltage that the host provides to memory card 330, which may be at different voltage levels depending on the host to which memory card 330 is connected.

A memory input/output portion 332c of controller die 332 is connected to memory die 340 by multiple conductors forming a bus 342. Memory input/output portion 332c provides an interface with memory die 340. Memory input/output portion 332c receives a power supply 344 that is connected to the output of voltage regulation circuit 346. Thus, the power supply to the memory input/output portion 332c is provided at a fixed voltage level Vo that does not depend on the voltage $V_{DD}$ provided by the host.

A controller input/output portion 340a of memory die 340 is connected to input/output portion 332c of controller die 332 through multiple conductors that form bus 342 for exchanging data, commands and status information between controller die 332 and memory die 340. Controller input/output portion 340a provides an interface with controller die 332. Controller input/output portion 340a receives a power supply 348 that is connected to the output of voltage regulation circuit 346. Thus, the power supply to controller input/output portion 340a is provided at a fixed voltage level Vo that does not depend on the voltage $V_{DD}$ provided by the host.

A memory core portion 340b includes one or more memory arrays and certain peripheral circuits. Memory core portion 340b receives a power supply 350 that is connected to the output of voltage regulation circuit 346. Thus, the power supply to memory core portion 340b is provided at a fixed voltage level Vo that does not depend on the voltage $V_{DD}$ provided by the host. Memory die 340 is a single voltage (not a dual voltage) die in this example.

Figure 3B:
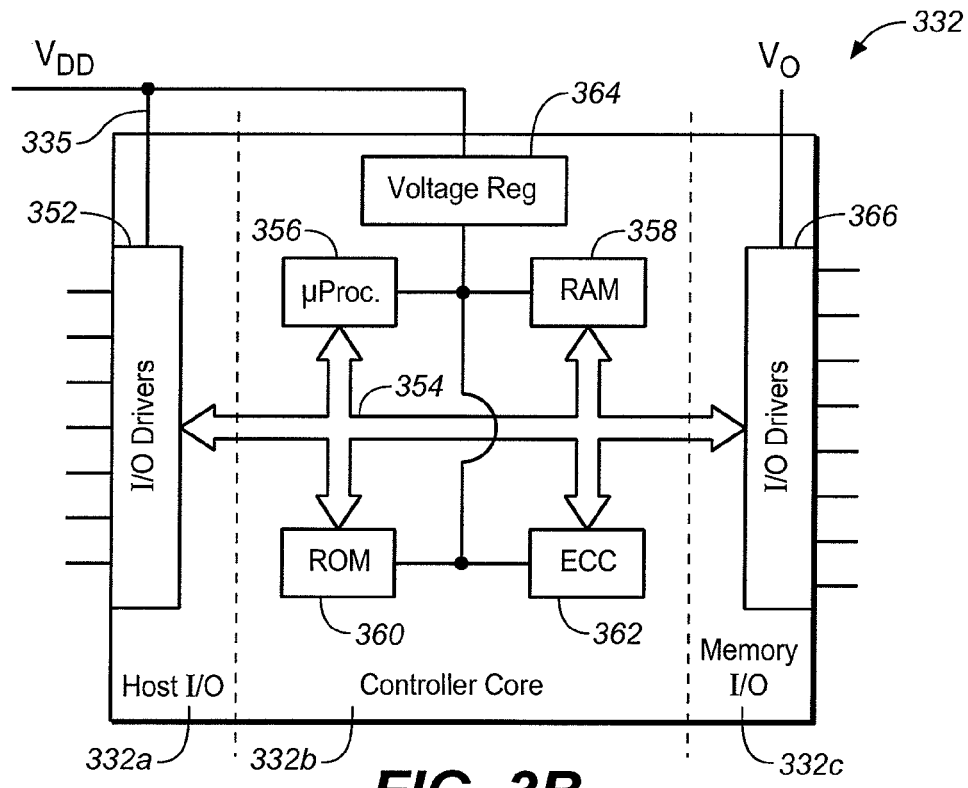
FIG. 3B shows a more detailed view of the controller die of FIG. 3A including certain circuits that are present in the controller die.

FIG. 3B shows a more detailed view of controller die 332 of FIG. 3A. In particular, FIG. 3B shows three portions 332a-c of controller die 332 and certain components in each portion. The host input/output portion 332a contains input/output drivers 352 connected to conductors that connect to the physical interface with the host. Input/output drivers 352 receive a power supply at a voltage $V_{DD}$ that is the input voltage received from the host. Logical signals between the host and the host input/output portion 332a of the controller die 332 generally use $V_{DD}$ as a logical voltage level. Input/output drivers 352 are in communication with other circuits on controller die 332 through a data bus 354. Data bus 354 connects various components within controller core 332b including a microprocessor 356, Random Access Memory (RAM) 358, Read Only Memory (ROM) 360 and Error Correction Code (ECC) circuits 362. Other components may also be present in controller core 332b.

An internal voltage regulation circuit 364 is located in memory core 332b. Internal voltage regulation circuit 364 receives an input voltage at the voltage $V_{DD}$ provided by the host. Internal voltage regulation circuit 364 converts this voltage to an output voltage for use by components within controller core 332b. In this way, the controller die 332 may operate with more than one input voltage level. Typically, such a controller die is designed to work with two different input voltage levels and is considered a dual voltage controller. For example, a controller may be designed to operate at either 1.8 volts or 3.3 volts. These are nominal voltages and some deviation is allowed from either voltage level so that two voltage ranges are defined, for example 1.7 volts to 1.95 volts and 2.7 volts to 3.6 volts. It will be understood that some deviation from a nominal voltage is generally permissible. Thus, a dual voltage memory card may be considered to refer to a card that accepts a power supply within one of two different voltage ranges. In some cases, a memory card may considered a dual voltage memory card where it accepts a power supply within a single continuous voltage range that includes two particular voltages used by host systems.

Data bus 354 also connects to memory input/output drivers 366 in memory input/output portion 332c of controller 332. Memory input/output drivers 366 drive logical signals through conductors to memory die 340. Memory input/output drivers 366 receive a power supply at a voltage level Vo that is the output voltage of voltage regulation circuit 346. The voltage Vo is independent of the input voltage $V_{DD}$ received from the host. Memory input/output drivers 366 drive signals through conductors at voltage levels determined by the power supply they receive. Where the received power is at a voltage level Vo, signals are sent at a voltage level Vo (and another voltage level, generally ground). Thus, voltage level Vo may signify a logical "1" and ground, or zero volts, may signify a logical "0." Alternatively Vo may signify a logical "0" and ground may signify a logical "1."

Figure 4A:
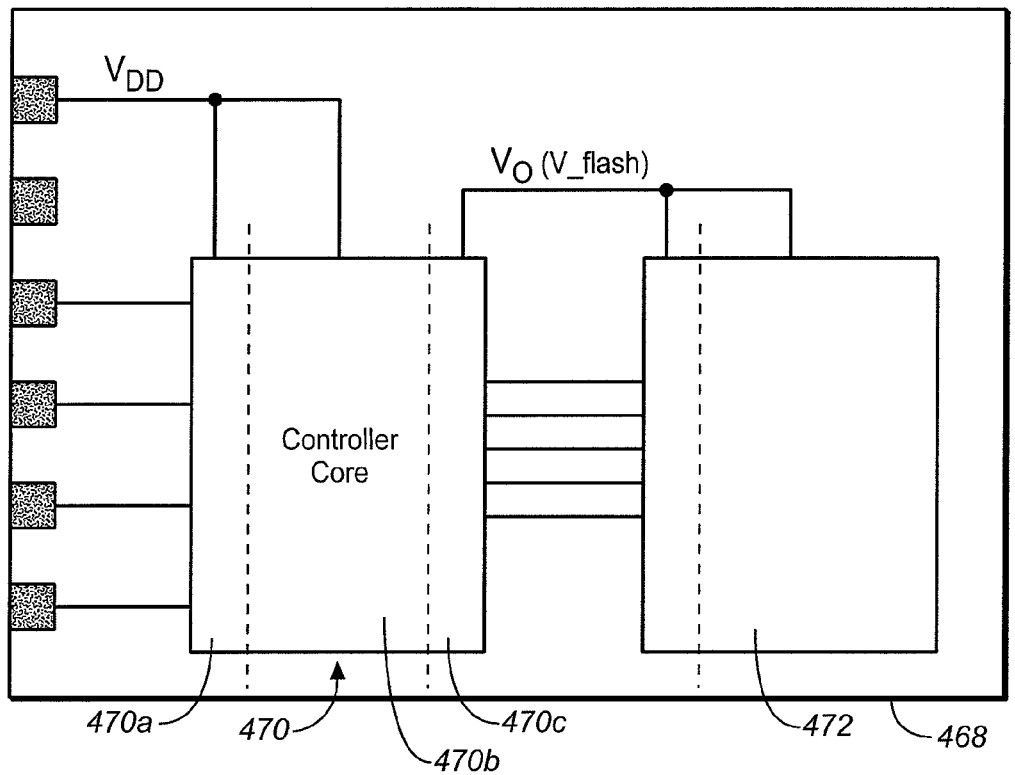
FIG. 4A shows an alternative dual voltage memory card where a controller die includes a voltage regulation circuit that provides a regulated voltage to a memory die.

FIG. 4A shows a memory card 468 having an alternative arrangement to that of FIGS. 2, 3A and 3B. In the arrangement shown in FIG. 4A no separate voltage regulation circuit is provided in the memory card 468 because voltage regulation is performed in a controller die. A supply voltage $V_{DD}$ is provided by the host as before. Voltage $V_{DD}$ is supplied to a controller die 470 including both the host input/output circuit 470a and controller core 470b. A voltage $V_O$ (V_flash) is generated in controller die 470 and is provided to internal circuits of controller die 470 and to memory die 472. Thus, no separate voltage regulator is required in this configuration.

Figure 4B:
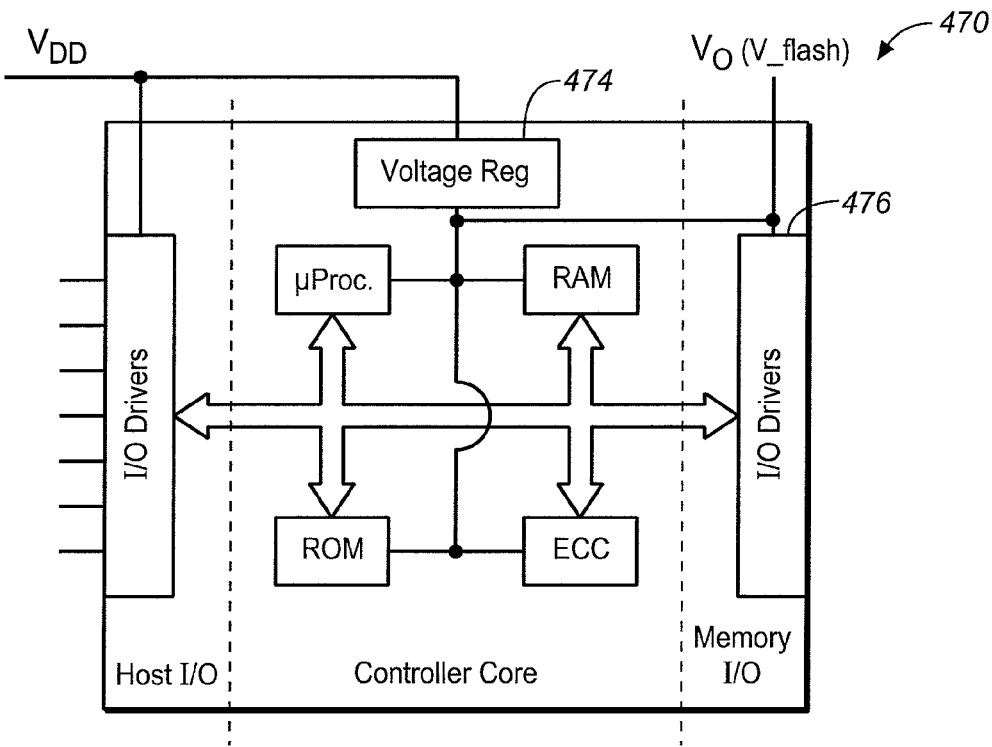
FIG. 4B shows a more detailed view of the controller die of FIG. 4A including an internal voltage regulation circuit that provides a regulated output to circuits of the controller die and as an output from the controller die.

FIG. 4B shows a more detailed view of controller die 470 of FIG. 4A. Controller die 470 is similar to that of FIG. 3B and includes an internal voltage regulation circuit 474 that provides a regulated voltage to internal circuits of controller die 470. However, in contrast to the controller die of FIG. 3B, the voltage regulation circuit of this controller die also provides a regulated voltage $V_O$ as an output that is supplied to the memory die 472 ($V_O$ may also be referred to as V_flash, the voltage supplied to the flash memory array). Thus, the voltage regulation circuit is responsible for providing a regulated voltage for both internal circuits such as input/output drivers 476 and circuits external to controller die 470. Where other circuits are provided in addition to those of the controller die 470 and memory die 472, the voltage $V_O$ may also be provided to such circuits.

Figure 5:
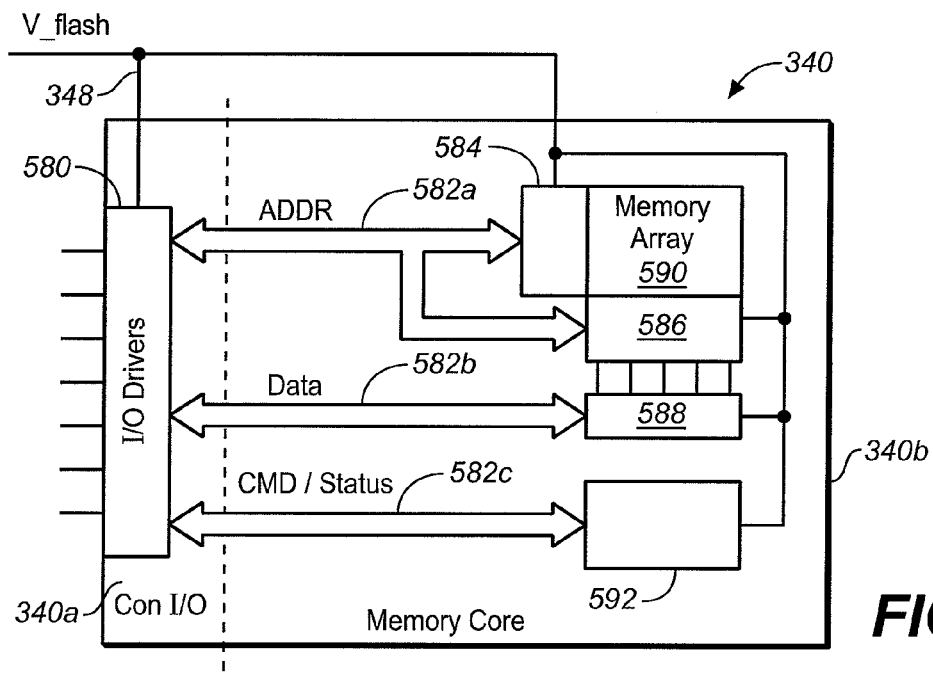
FIG. 5 shows a more detailed view of the memory die of FIG. 3A including certain circuits that are present in the memory die.

FIG. 5 shows a more detailed view of single voltage memory die 340 of FIG. 3A showing certain components of the controller input/output portion 340a and the memory core portion 340b of memory die 340 (single voltage memory die 472 may have an identical or similar structure). The controller input/output portion 340a is shown having controller input/output drivers 580 connected to conductors of bus 342 that goes to controller die 332. The controller input/output drivers 580 receive a power supply 348 at a voltage level Vo that is the output voltage of voltage regulation circuit 346. Thus, controller input/output drivers 580 drive conductors at voltage levels Vo and ground, similarly to memory input/output drivers 366 in the controller die 332 and signals exchanged between these drivers use the same voltage levels.

Controller input/output drivers 580 are connected to other circuits on the memory die 340 by three busses 582a-c in this example. An address bus 582a carries address information between input/output drivers 580 and row control circuits 584 and also column control circuits 586. A data bus 582b carries data between input/output drivers 580 and data input/output circuits 588 connected to memory array 590. A control/status bus 582c carries commands and status information between input/output drivers 580 and command interface circuits 592 of memory die 340.

Row control circuits 584, column control circuits 586, data input/output circuits 588 and command interface circuits 592 are all provided with power supplied at the voltage level Vo from the output of voltage regulation circuits 346. In addition to the circuits shown in the memory die 340, additional circuits may also be provided and may be supplied at a voltage level Vo. Memory die 340 is supplied at a voltage level Vo even when the voltage $V_{DD}$ supplied by the host varies, so that memory die 340 always receives a single voltage level Vo. Therefore, memory die 340 does not have to be a dual voltage memory die and may be a single voltage memory die. For example, memory die 340 may only work with a power supply at 1.8 volts (or a range from 1.7 volts to 1.95 volts), or memory die 340 may only work with a power supply at 3.3 volts (or a range from 2.7 volts to 3.6 volts).

Although memory die 340 may be a single voltage memory die that is not capable of operating with different power supply voltage levels, more than one voltage level may be present within memory die 340. High voltages are commonly created on memory dies to allow for writing and erasing data in a memory array. Charge pumps or other circuits may be provided on the memory die to develop such voltages from the power supply voltage Vo.

Figure 6:
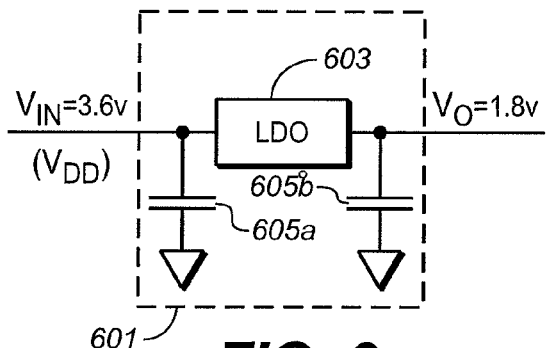
FIG. 6 shows a voltage regulation circuit that provides a stable, predetermined output voltage at a level that is always less than or equal to the input voltage. By design, the input voltage is always greater than or equal to the desired output.

FIG. 6 shows a voltage regulation circuit 601, according to an embodiment of the present invention, that provides a stable, predetermined output voltage at a level that is always less than or equal to the input voltage. By design, the input voltage is always greater than or equal to the desired output. According to this embodiment, when a host provides a power supply at a high voltage level, voltage regulation circuit 601 provides an output that is at a lower voltage level than the input. Thus, the voltage regulation circuit has a voltage reduction capability and may be used with single voltage memory dies that require a power supply at a low voltage. When the host provides a power supply at a low voltage level, the voltage regulation circuit may provide an output that is at the same level as the input.

In this example, a host provides a power supply at either 3.3 volts (as shown in FIG. 6) or 1.8 volts and, in either case, the voltage regulation circuit 601 provides an output at 1.8 volts. The voltage regulating circuit includes a Low Dropout (LDO) regulator die 603 which converts a 3.3 volt input voltage to a 1.8 volt output voltage. In addition to the LDO regulator die 603, capacitors 605a, 605b are provided as part of voltage regulation circuit 601. Also, in some embodiments a sensing circuit may be provided that senses whether the input voltage supplied by the host is at a high level or a low level. When the input voltage is at a high level, an LDO is used to reduce the output to a low voltage level. When the input is at a low level, the LDO may be bypassed and the input voltage may be provided directly as the output of the voltage regulation circuit.

Voltage regulation circuit 601 contains a Low DropOut (LDO) regulator that can convert a high voltage (such as 3.3 volts) to a lower voltage (such as 1.8 volts). An example of a suitable voltage regulator is a Torex XC6215. Generally an LDO regulator uses one or more (in this case, two) capacitors. Thus, the voltage regulation circuit may be comprised of at least one die (integrated circuit) and may also include one or more discrete devices. This type of voltage regulation circuit is suitable for use with a single voltage memory die that is designed for a low voltage (for example, 1.8 volts) in a dual voltage memory card that is to operate at both a high voltage and a low voltage (3.3 volts and 1.8 volts in this example).

Figure 7:
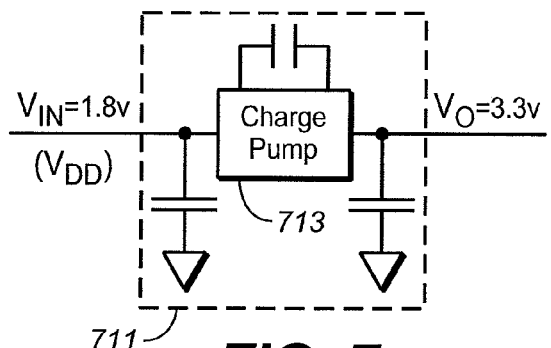
FIG. 7 shows a voltage regulation circuit that provides a stable, predetermined output voltage from an input range that can be above or below the output voltage.

FIG. 7 shows a voltage regulation circuit 711, according to an alternative embodiment, that provides a stable, predetermined output voltage from an input range that can be above or below the output voltage. According to this embodiment, when a host provides a power supply at a low level, the voltage regulation circuit provides an output that is at a higher voltage level than the input. Thus, voltage regulation circuit 711 has a voltage boosting capability. When a host provides power at a high voltage level, voltage regulation circuit 711 may provide an output that is at the same voltage level as the input. This type of voltage regulation circuit may be used with a single voltage memory die. Whether the voltage input from a host is at a high level or a low level, the memory die receives its power supply at a high level. In one example, a single voltage memory die operates with a power supply voltage of 3.3 volts. Such a memory die may be used in a dual voltage memory card that receives a power supply from a host at either 3.3 volts or 1.8 volts. A voltage regulation circuit provides an output voltage at 3.3 volts to the memory die in either case. In particular, when the host provides a voltage of 1.8 volts, the voltage regulation circuit increases the voltage to an output voltage of 3.3 volts. In some cases, voltage regulation circuit 711 may also have a voltage reduction capability. Voltage regulation circuit 711 may regulate a voltage within a certain range to achieve a predetermined output voltage that is lower than the range. For example, where a host provides a voltage between 3.3 volts and 3.6 volts, voltage regulation circuit 711 may provide an output at 3.3 volts.

In the example of FIG. 7 voltage regulation circuit 711 includes a charge pump circuit on a die 713 to provide an output voltage that is higher than the input voltage. Voltage regulation circuit 711 operates as a regulated voltage doubler that accepts an input voltage over a wide range (for example, 1.7 volts to 3.6 volts) and provides an output voltage that is within a much narrower voltage range suitable for a single voltage memory die (for example, 2.7 volts to 3.6 volts). Commercially available dies may be used in such a voltage regulation circuit. One example is a "MAXI1759" from Maxim, which may be configured with capacitors such as Murata 0603 4.7 uF low profile ceramic capacitors. Thus, voltage regulation circuit 711 may include one or more integrated circuits and also include one or more discrete devices. Such a circuit may be switched from operating as a charge pump to operate as a voltage follower so that when a high voltage is provided by a host, the voltage regulation circuit provides the same high voltage level as an output with a high efficiency. Charge pumps may generally be formed having a low profile that fits within the physical constraints of low profile memory cards (in some cases, components may be required to have a thickness not greater than 0.5 millimeters or 0.55 millimeters).

Figure 8:
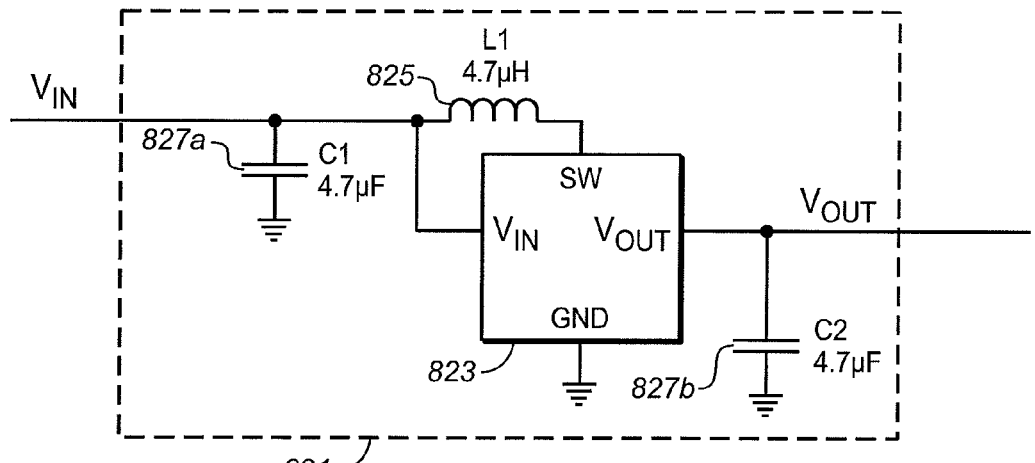
FIG. 8 shows an alternative voltage regulation circuit that uses an inductor to provide an output voltage at a level that is higher than the input voltage level when the input voltage level is low.

In an alternative to using a charge pump, a high frequency buck/boost converter may also be used to generate an output voltage that is higher than an input voltage to a voltage regulation circuit. A buck/boost converter may be formed with a low profile inductor so that the profile of the voltage regulation circuit is within the limits for a memory card. An example of a voltage regulation circuit 821 that uses an inductor to boost an input voltage is shown in FIG. 8. Voltage regulation circuit 821 includes a converter die 823, an inductor 825 and two capacitors 827*a-b*. Voltage regulation circuits such as circuits 821, 711 and 601 may be implemented as separate circuits as shown here, or may be implemented as part of a controller chip or ASIC.

In general, dies within a memory system such as a memory card are all supported by a Printed Circuit Board (PCB) and may be interconnected by traces on the PCB. In one alternative arrangement, certain dies may be stacked in an arrangement that reduces the area occupied by the dies and so provides an economical arrangement. In particular, a voltage regulation die may be stacked on a controller die or on a memory die. Connections may be made directly between such dies without connection to the PCB.

In general, separate dies have separate chip enable (CE) inputs that allow dies to be individually placed in a powered-down condition. In an arrangement where voltage regulation is located, at least partially, on a separate chip (not on the memory die or controller die), this regulator die may be separately placed in a power-down condition. This may allow for more power efficiency by turning off the regulator die whenever it is not needed.

One particular application for dual voltage memory cards is for small memory cards that are suitable for use in mobile devices such as cell phones. One example is the Memory Stick Micro (M2) card, which supports operating voltages of 1.8 volts and 3.3 volts. Other dual voltage memory cards include CompactFlash cards that support operating voltages of 5.0 volts and 3.3 volts.

While the above embodiments relate to a memory card having a single contact that supplies power from hosts at two or more different voltages, in cases, more than one contact may be used. For example, a memory card may have separate sets of contacts, forming separate physical interfaces to interface with different hosts. A card having two or more different physical interfaces may be used with hosts that not only supply power at different voltages but also have receptacles with different physical dimensions. In such memory cards, a first power supply contact is provided in a first interface and a second power supply contact is provided in a second interface. These power supply contacts may both connect to a voltage regulation circuit that then provides an output at a constant voltage level to one or more circuits in the memory card.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to exemplary embodiments and variations thereof, it will be understood that the invention is entitled to protection within the full scope of the appended claims.

The invention claimed is:

1. A method of operating a removable, nonvolatile memory card having a memory die and a controller die, comprising:
   receiving an input voltage from a host;
   supplying the input voltage to the controller die;
   on the removable, non-volatile memory card, providing a single dedicated voltage regulation die separate from the memory die and the controller die and including a voltage regulation circuit that is capable of receiving plural distinct input voltage levels in the group of 1.8V, 3.3V, and between 3.3V and 3.6V from the host and regardless of which one of the plural distinct input voltage levels in the group is supplied by the host, for supplying the same output voltage level of 3.3V to a memory die by:
       if the input voltage is at 3.3V, then supplying the input voltage to a memory die;
       if the input voltage is 1.8V, then converting the input voltage to an output voltage of 3.3V in the voltage regulation circuit on the dedicated voltage regulation die and providing the output voltage to the memory die;
       if the input voltage is between 3.3V and 3.6V, then converting the input voltage to an output voltage of 3.3V in the voltage regulation circuit on the dedicated voltage regulation die and providing the output voltage to the memory die;
       wherein the voltage circuit is switched to operate as a charge pump when the input voltage is 1.8V and as a voltage follower when the input voltage is 3.3V; and
       wherein the memory die comprises a single power supply voltage level memory die.

2. The method of claim 1 further comprising supplying the output voltage to interface circuits on the controller die.

3. The method of claim 1 wherein the input voltage is greater than the output voltage.

4. The method of claim 3 wherein the voltage regulation die includes a Low Dropout (LDO) regulator.

5. The method of claim 1 wherein the first level of voltage is less than the second level of voltage.

6. A method of operating a removable, nonvolatile memory card having a memory die and a controller die, comprising:
   receiving an input voltage from a host;
   supplying the input voltage to the controller die;

on the removable, non-volatile memory card, providing a single dedicated voltage regulation die separate from the memory die and the controller die and including a voltage reduction circuit that is capable of receiving input voltage levels of 1.8V or 3.3V from the host and regardless of which one of the input voltage levels is supplied by the host, for supplying the same output voltage level of 1.8V to the memory die by:
- if the input voltage is at a low level then supplying the input voltage to the memory die;
- if the input voltage is at a high level then reducing the input voltage to an output voltage in the voltage reduction circuit, and providing the output voltage to the memory die;
- wherein the dedicated voltage reduction die is stacked on the controller die;
- wherein the memory die comprises a single power supply voltage level memory die; and
- wherein the removable, non-volatile memory card includes different physical interfaces for interfacing with different hosts, the interfaces including a first interface having first power supply contact for receiving power from a first host and a second interface having a second power supply contact for receiving power from a second host, wherein both power supply contacts connect to the voltage regulation circuit, and wherein the voltage regulation circuit provides a constant output voltage level to the memory die.

7. The method of claim 6 further comprising supplying the output voltage to interface circuits on the controller die.

8. The method of claim 6 wherein the voltage reduction circuit includes a Low Dropout (LDO) regulator.

9. A method of operating a removable nonvolatile memory card having a memory die and a controller die, comprising:
- receiving an input voltage from a host;
- supplying the input voltage to the controller die;
- on the removable, non-volatile memory card, providing a single dedicated voltage regulation die separate from the memory die and the controller die and including a voltage regulation circuit that is capable of receiving input voltage levels in the group of 1.8V, 3.3V and between 3.3V and 3.6V from the host and regardless of which one of the input voltage levels in the group is supplied by the host, for supplying the same output voltage level of 3.3V to the memory die by:
  - if the input voltage is at a high level, operating the voltage regulation circuit as a voltage follower and supplying the input voltage to the memory die;
  - if the input voltage is at a low level, operating the voltage regulation circuit as a charge pump that produces an output voltage of 3.3V and provides the output voltage to the memory die;
  - wherein the memory die comprises a single power supply voltage level memory die; and
  - wherein the removable, non-volatile memory card includes different physical interfaces for interfacing with different hosts, the interfaces including a first interface having a first power supply contact for receiving power from a first host and second interface having a second power supply contact for receiving power from the second host, wherein both power supply contacts connect to the voltage regulation circuit wherein the voltage regulation circuit provides a constant output voltage level to the memory die.

10. The method of claim 9 wherein the input voltage is supplied to other circuits on the controller die.

11. The method of claim 9 wherein the dedicated die is stacked on the controller die.

12. The nonvolatile memory card of claim 1 wherein the memory die includes row and column control circuits that receive the output voltage of the voltage regulation circuit.

13. The nonvolatile memory card of claim 6 wherein the memory die includes row and column control circuits that receive the output voltage of the voltage reduction circuit.

14. The nonvolatile memory card of claim 9 wherein the memory die includes row and column control circuits that receive the output voltage of the voltage boosting circuit.

* * * * *